(12) United States Patent
Guenther

(10) Patent No.: US 6,660,547 B2
(45) Date of Patent: Dec. 9, 2003

(54) STABILIZATION FOR THIN SUBSTRATES

(75) Inventor: Ewald Karl Michael Guenther, Singapore (SG)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/915,807

(22) Filed: Jul. 26, 2001

(65) Prior Publication Data

US 2003/0020124 A1 Jan. 30, 2003

(51) Int. Cl.$^7$ .............................. H01L 21/00
(52) U.S. Cl. ..................... 438/26; 438/33; 438/464; 438/976
(58) Field of Search ................ 438/25, 26, 33, 438/99, 113, 114, 117, 464, 780–782, 976

(56) References Cited

U.S. PATENT DOCUMENTS 4,198,263 A * 4/1980 Matsuda ..................... 216/12
5,051,326 A * 9/1991 Celler et al. .................... 430/5
5,723,385 A * 3/1998 Shen et al. .................. 438/763
6,265,820 B1 * 7/2001 Ghosh et al. ............... 313/483

OTHER PUBLICATIONS

Burroughs et al., "Light–emitting diodes based on conjugated polymers", Nature, London, vol. 347, 539–541, 1990, London.

* cited by examiner

Primary Examiner—Amir Zarabian
Assistant Examiner—Jamie L. Brophy
(74) Attorney, Agent, or Firm—Fish & Richardson P.C.

(57) ABSTRACT

A substrate support rim used in the fabrication of devices such as organic light emissive diodes (OLEDs) is disclosed. The support rim, which is located at the edge of a substrate, serves to reinforce the substrate, facilitating handling during and after the fabrication process to reduce damage to the device. The support rim comprises, for example, epoxy, adhesives or other materials that adhere to the substrate.

65 Claims, 2 Drawing Sheets

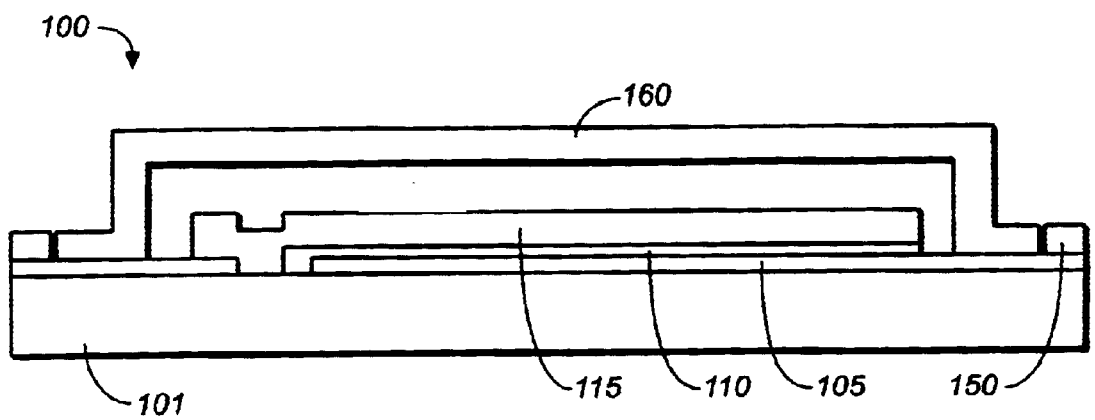
FIG._1 (PRIOR ART)
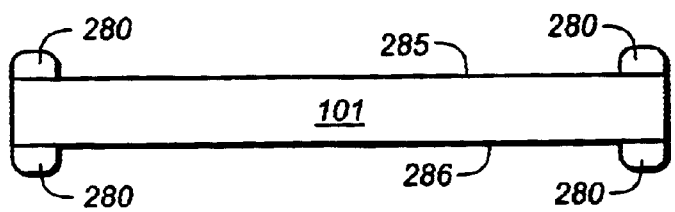
FIG._2
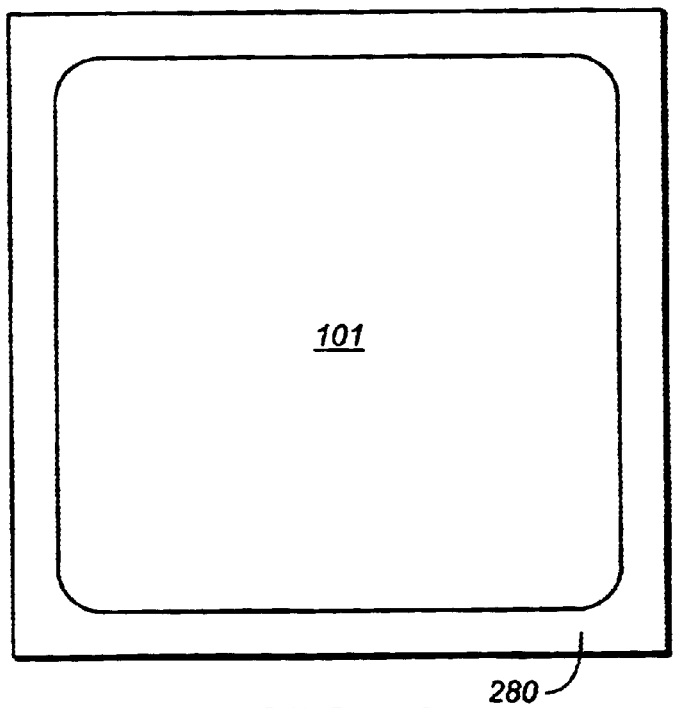
FIG._3

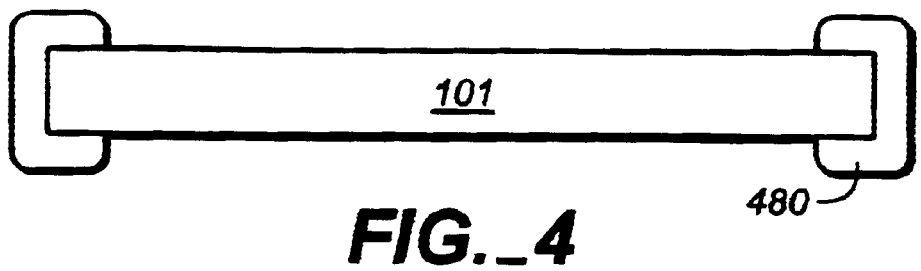
FIG._4
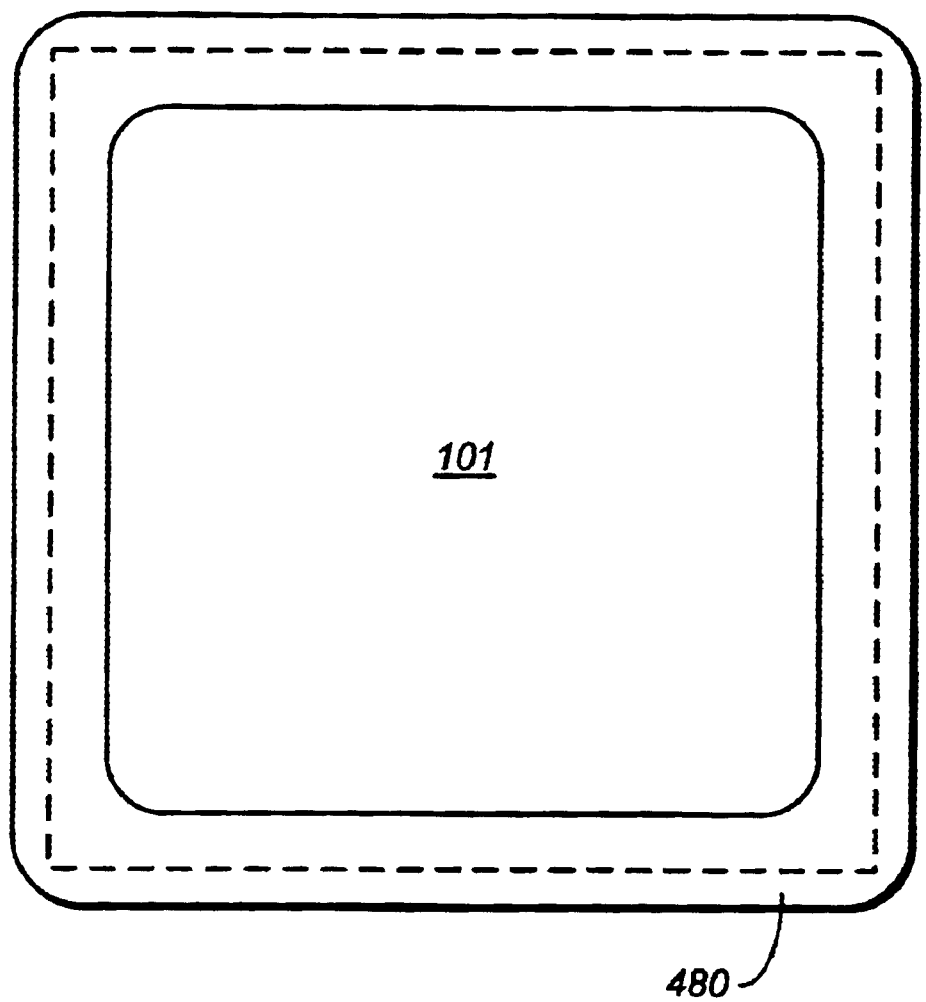
FIG._5

US 6,660,547 B2

STABILIZATION FOR THIN SUBSTRATES

FIELD OF THE INVENTION

The present invention relates to thin substrates used in fabricating devices. More particularly, the invention relates to reinforcements for thin substrates.

BACKGROUND OF THE INVENTION

Thin or ultra thin glass substrates have been proposed for use in fabricating devices. The thin glass substrates are particularly suitable for forming flexible devices, such as organic light emitting diodes (OLEDs). FIG. 1 shows a conventional OLED device 100. The OLED device comprises one or more organic functional layers 110 between first and second electrodes 105 and 115 formed on a thin substrate 101. The electrodes can be patterned to form, for example, a plurality of OLED cells. The cells are used to form a pixelated or segmented OLED device. Bond pads 150, which are coupled to the first and second electrodes, are provided to enable electrical connections to the OLED cells. A cap 160 encapsulates the device to protect the OLED cells from the environment such as moisture and/or air.

To manufacture thin glass substrates, a large sheet of thin glass is first fabricated. The large sheet is then cut to create substrates of the desired size. However, the cutting process may cause defects at the edges of the substrates. These defects make the substrates susceptible to cracking during and after fabrication, thus damaging the devices. This undesirably reduces yields and increase production cost.

As evidenced from the above discussion, it is desirable to provide a thin substrate which is less prone to damage during fabrication of devices.

SUMMARY OF THE INVENTION

The invention relates to reinforcements of substrates used in the fabrication of, for example, OLEDs. Such substrates, which are typically made of glass, are brittle and thus are quite susceptible to damage from handling. The reinforcement comprises a support rim at the edge of the substrate. The support rim can be located on the upper, lower, or both surfaces of the substrate. The support rim comprises epoxy, adhesives, or other types of materials which adhere to the substrate. The support rim can be formed using various techniques such as laminating, screen printing, photolithography, dip coating or roll coating.

BRIEF DESCRIPTION OF THE DRAWINGS

FIG. 1 shows an OLED device; and

FIGS. 2–5 show various embodiments of the invention.

PREFERRED EMBODIMENTS OF THE INVENTION

The invention relates generally to substrates used in fabrication of devices, such as OLED devices. More particularly, the invention provides reinforcements for the substrates. The reinforcements reduce the substrates susceptibility to damage during fabrication or handling.

FIGS. 2 and 3 show, respectively, cross-sectional and plan views of a substrate 101 in accordance with one embodiment of the invention. The substrate, for example, comprises silicate glass, such as borosilicate glass. Other materials, such as sodalime glass or other transparent materials are also useful. Typically, the thickness of the substrates is about 0.01–0.2 mm.

The substrate is provided with a substrate support rim 280. In one embodiment of the invention, the support rim is located at about the edge of the substrate. The support rim is sufficient to stabilize the substrate, reducing its susceptibility to cracking. The width and thickness of the support rim, for example, are about 0.5 mm and about 0.01–1 mm, respectively. By providing the support rim which occupies a small portion of the substrate, its impact on the mechanical properties, such as flexibility is low. Furthermore, the support rim can advantageously facilitate handling of the substrate without affecting the sensitive active area. Also applying the support rim only at the edge, reduces material cost and increases material selection freedom since compatibility with display materials and optical properties are less crucial.

In one embodiment, the rim is provided at least on one of the major surfaces of the substrate. For example, the support rim is provided at either the top or bottom surface (285 or 286) of the substrate. In one embodiment, the support rim is preferably provided at the bottom surface. The width and thickness of the support rim, for example, are about 0.1–0.5 mm and about 0.01–1 mm, respectively. Alternatively, support rims are provided on both the top and bottom surfaces of the substrate.

In one embodiment, the support rim comprises a material such as epoxy, acrylate or other types of adhesives. Other materials such as polyimide, polyamide, silicone resins, novolak resins, or dry resist are also useful. Other materials which adhere to the substrate and are more dutile than the substrate are also useful. The support rim can be formed by dispensing the materials around the edges of the substrate. Other techniques for forming the support rim, including laminating, screen printing, dip coating, roll coating, or other printing techniques as well as photolithography, are also useful. The support rim can be cured with, for example, UV or heat after being formed on the edges of the substrate to improve mechanical protection of the substrate. Other curing techniques, such as e-beam curing, are also useful.

As described, the support rim located in the non-active region of device. By restricting the support rim to the non-active region, device performance is not adversely impacted. Furthermore, since the support rim occupies a small portion of the substrate, its impact on the mechanical properties of the substrate, such as flexibility, is low.

FIGS. 4 and 5 show respective cross-sectional and plan views of an alternative embodiment of the invention. As shown, a support rim 480 covers edges as well as sides of the substrate 101. The support rim, for example, covers about 0.5 mm of the edge of the substrate. By covering the sides of the substrate, the support rim provides added protection from cracking due to defects located at the edges of the substrate. Materials such as epoxy, acrylate, polyimide, polyamide, silicone resins, novolak resins, or dry resist can be used to form the support rim. In one embodiment, the support rim is formed by dipping the edges of the substrate in a bath containing the support rim material, thereby coating the edges and sides of the substrate. Other techniques, such as laminating, dip coating, roll coating, screen printing, dispensing, or other printing techniques as well as combination with photolithography and spin coating, curtain coating, meniscus coating, spray coating or other techniques used for uniform coating are also useful. The support rim can be cured after being formed on the edges of the substrate to improve mechanical protection of the substrate.

After the substrate has been prepared with the support rim, additional processing is performed to complete the device. In one embodiment, the process continues to form OLED devices. Fabrication of OLED devices is described in, for example J. H. Burroughes et al., Nature (London) 347, 539 (1990), which is herein incorporated by reference for all purpose. To form an OLED device, an organic layer can be formed on a bottom electrode deposited on the substrate. A top electrode is formed onto the organic layer. In accordance with the invention, the support rim is compatible with the production process as well as subsequent usage of the OLED device (e.g. optional transparency for display application).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for reinforcing a substrate on which an OLED device is formed comprising:
   providing a substrate with two major surfaces and one or more sides;
   forming a support rim on at least one of the two major surfaces at an edge adjacent to at least one of the one or more sides, the support rim comprising a resin material; and
   processing the substrate by forming an organic layer between two conductive layers on the substrate to complete the OLED device.

2. The method of claim 1 wherein the substrate comprises silicate glass or sodalime glass.

3. The method of claim 2 wherein the support rim comprises a material which adheres to the substrate.

4. The method of claim 3 wherein the material is more ductile than the substrate.

5. The method of claim 1 wherein the substrate comprises a brittle material.

6. The method of claim 5 wherein the support rim comprises a material selected from the group consisting of adhesives, epoxy resins, acrylate, polyimide, polyamide, silicon resins, novalak resins and dry resins.

7. The method of claim 5 wherein the support rim comprises a material which adheres to the substrate.

8. The method of claim 7 wherein the material is more ductile than the substrate.

9. The method of claim 1 wherein the support rim comprises a material selected from the group consisting of adhesives, epoxy resins, acrylate, polyimide, polyamide, silicon resins, novalak resins and dry resins.

10. The method of claim 9 wherein the support rim comprises a material which adheres to the substrate.

11. The method of claim 10 wherein the material is more ductile than the substrate.

12. The method of claim 1 wherein the at least one of the two major surfaces of the substrate comprises a bottom surface.

13. The method of claim 12 further comprising curing the support rim after being formed.

14. The method of claim 13 wherein the curing comprises uv curing, thermal curing, or e-beam.

15. The method of claim 14 wherein forming the support rim comprises laminating, printing, screen printing, dispensing, photolithography, spin coating, curtain coating, meniscus coating, spray coating, dip coating, roll coating, uniform coating technique, or combination thereof.

16. The method of claim 15 wherein the substrate comprises a thickness of about 0.01–0.2 mm.

17. The method of claim 13 wherein forming the support rim comprises laminating, printing, screen printing, dispensing, photolithography, spin coating, curtain coating, meniscus coating, spray coating, dip coating, roll coating, uniform coating technique, or combination thereof.

18. The method of claim 17 wherein the substrate, comprises a thickness of about 0.01–0.2 mm.

19. The method of claim 12 wherein forming the support rim comprises laminating, printing, screen printing, dispensing, photolithography, spin coating, curtain coating, meniscus coating, spray coating, dip coating, roll coating, uniform coating technique, or combination thereof.

20. The method of claim 19 wherein the substrate comprises a thickness of about 0.01–0.2 mm.

21. The method of claim 12 wherein the substrate comprises a thickness of about 0.01–0.2 mm.

22. The method of claim 1 wherein the major surface of the substrate comprises a top surface.

23. The method of claim 22 wherein forming the support rim further includes forming the support rim on sides of the substrate.

24. The method of claim 23 further comprises curing the support rim after being formed.

25. The method of claim 24 wherein forming the support rim comprises laminating, printing, screen printing, dispensing, photolithography, spin coating, curtain coating, meniscus coating, spray coating, dip coating, roll coating, uniform coating technique, or combination thereof.

26. The method of claim 25 wherein the substrate comprises a thickness of about 0.01–0.2 mm.

27. The method of claim 24 wherein the curing comprises uv curing, thermal curing, or e-beam.

28. The method of claim 27 wherein forming the support rim comprises laminating, printing, screen printing, dispensing, photolithography, spin coating, curtain coating, meniscus coating, spray coating, dip coating, roll coating, uniform coating technique, or combination thereof.

29. The method of claim 28 wherein the substrate comprises a thickness of about 0.01–0.2 mm.

30. The method of claim 22 further comprises curing the support rim after being formed.

31. The method of claim 30 wherein the curing comprises uv curing, thermal curing, or e-beam.

32. The method of claim 31 wherein forming the support rim comprises laminating, printing, screen printing, dispensing, photolithography, spin coating, curtain coating, meniscus coating, spray coating, dip coating, roll coating, uniform coating technique, or combination thereof.

33. The method of claim 32 wherein the substrate comprises a thickness of about 0.01–0.2 mm.

34. The method of claim 30 wherein forming the support rim comprises laminating, printing, screen printing, dispensing, photolithography, spin coating, curtain coating, meniscus coating, spray coating, dip coating, roll coating, uniform coating technique, or combination thereof.

35. The method of claim 34 wherein the substrate comprises a thickness of about 0.01–0.2 mm.

36. The method of claim 23 wherein forming the support rim comprises laminating, printing, screen printing, dispensing, photolithography, spin coating, curtain coating, meniscus coating, spray coating, dip coating, roll coating, uniform coating technique, or combination thereof.

37. The method of claim 36 wherein the substrate comprises a thickness of about 0.01–0.2 mm.

38. The method of claim 23 wherein the substrate comprises a thickness of about 0.01–0.2 mm.

39. The method of claim 1 wherein forming the support rim comprises forming the support rim on edges of both top and bottom surfaces of the substrate.

40. The method of claim 39 wherein forming the support rim further includes forming the support rim on sides of the substrate.

41. The method of claim 40 further comprises curing the support rim after being formed.

42. The method of claim 41 wherein forming the support rim comprises laminating, printing, screen printing, dispensing, photolithography, spin coating, curtain coating, meniscus coating, spray coating, dip coating, roll coating, uniform coating technique, or combination thereof.

43. The method of claim 42 wherein the substrate comprises a thickness of about 0.01–0.2 mm.

44. The method of claim 41 wherein the curing comprises uv curing, thermal curing, or e-beam.

45. The method of claim 44 wherein forming the support rim comprises laminating, printing, screen printing, dispensing, photolithography, spin coating, curtain coating, meniscus coating, spray coating, dip coating, roll coating, uniform coating technique, or combination thereof.

46. The method of claim 45 wherein the substrate comprises a thickness of about 0.01–0.2 mm.

47. The method of claim 39 further comprises curing the support rim after being formed.

48. The method of claim 47 wherein the curing comprises uv curing, thermal curing, or e-beam.

49. The method of claim 48 wherein forming the support rim comprises laminating, printing, screen printing, dispensing, photolithography, spin coating, curtain coating, meniscus coating, spray coating, dip coating, roll coating, uniform coating technique, or combination thereof.

50. The method of claim 49 wherein the substrate comprises a thickness of about 0.01–0.2 mm.

51. The method of claim 47 wherein forming the support rim comprises laminating, printing, screen printing, dispensing, photolithography, spin coating, curtain coating, meniscus coating, spray coating, dip coating, roll coating, uniform coating technique, or combination thereof.

52. The method of claim 51 wherein the substrate comprises a thickness of about 0.01–0.2 mm.

53. The method of claim 39 wherein forming the support rim comprises laminating, printing, screen printing, dispensing, photolithography, spin coating, curtain coating, meniscus coating, spray coating, dip coating, roll coating, uniform coating technique, or combination thereof.

54. The method of claim 53 wherein the substrate comprises a thickness of about 0.01–0.2 mm.

55. The method of claim 39 wherein the substrate comprises a thickness of about 0.01–0.2 mm.

56. The method of claim 1, wherein:
the support rim is formed on all edges of the at least one of the two major surfaces of the substrate.

57. The method of claim 1, wherein:
the support rim is formed to contact the edge of the substrate and all of the one or more sides.

58. A method for reinforcing a substrate on which an OLED device is formed comprising:
providing a substrate comprised of silicate glass or sodalime glass;
forming a support rim on an edge of at least one major surface of the substrate, wherein the support rim comprises a material selected from the group consisting of adhesives, epoxy resins, acrylate, polyimide, polyamide, silicon resins, novalak resins and dry resins; and
processing the substrate by forming an organic layer between two conductive layers on the substrate to complete the OLED device.

59. A method for reinforcing a substrate on which an OLED device is formed comprising:
providing a substrate with two major surfaces and one or more sides;
forming a support rim on an edge of at least one major surface of the substrate, where the support rim is on at least one of the one or more sides of the substrate; and
processing the substrate by forming an organic layer between two conductive layers on the substrate to complete the OLED device.

60. The method of claim 59 further comprising curing the support rim after being formed.

61. The method of claim 60 wherein forming the support rim comprises laminating, printing, screen printing, dispensing, photolithography, spin coating, curtain coating, meniscus coating, spray coating, dip coating, roll coating, uniform coating technique, or combination thereof.

62. The method of claim 61 wherein the substrate comprises a thickness of about 0.01–0.2 mm.

63. The method of claim 60 wherein the curing comprises uv curing, thermal curing, or e-beam.

64. The method of claim 63 wherein forming the support rim comprises laminating, printing, screen printing, dispensing, photolithography, spin coating, curtain coating, meniscus coating, spray coating, dip coating, roll coating, uniform coating technique, or combination thereof.

65. The method of claim 64 wherein the substrate comprises a thickness of about 0.01–0.2 mm.

\* \* \* \* \*